(12) United States Patent  
Pachauri et al.

(10) Patent No.: US 8,598,046 B2  
(45) Date of Patent: Dec. 3, 2013

(54) AUTOSYNTHESIZER FOR THE CONTROLLED SYNTHESIS OF NANO- AND SUB-NANOSTRUCTURES

(75) Inventors: Vivek Pachauri, Stuttgart (DE); Ashraf Ahmad, Stuttgart (DE); Kannan Balasubramanian, Stuttgart (DE); Klaus Kern, Waldenbuch (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 189 days.

(21) Appl. No.: 13/142,827

(22) PCT Filed: Dec. 28, 2009

(86) PCT No.: PCT/EP2009/009286  
§ 371 (c)(1),  
(2), (4) Date: Sep. 6, 2011

(87) PCT Pub. No.: WO2010/076008  
PCT Pub. Date: Jul. 8, 2010

(65) Prior Publication Data  
US 2011/0311438 A1 Dec. 22, 2011

(30) Foreign Application Priority Data

Dec. 30, 2008 (EP) .................................... 08022555  
Apr. 29, 2009 (EP) .................................... 09005932

(51) Int. Cl.  
*H01L 21/31* (2006.01)  
*B01J 8/00* (2006.01)

(52) U.S. Cl.  
USPC ........... 438/758; 438/759; 422/603; 423/349; 423/622

(58) Field of Classification Search  
USPC ............ 438/758, 759; 422/603; 423/349, 622  
See application file for complete search history.

(56) References Cited

U.S. PATENT DOCUMENTS

2002/0081250 A1* 6/2002 Lord .............................. 422/198  
2003/0126742 A1   7/2003 Ting et al.

(Continued)

FOREIGN PATENT DOCUMENTS

DE   10 2006 055 218 A1   5/2008  
EP        1 884 578 A1     2/2008

(Continued)

OTHER PUBLICATIONS

Machine translation of JP-2008-189520 A—Jul. 18, 2013.*

(Continued)

*Primary Examiner* — Walter D Griffin  
*Assistant Examiner* — Huy-Tram Nguyen  
(74) *Attorney, Agent, or Firm* — Kilpatrick Townsend & Stockton LLP

(57) ABSTRACT

The present invention relates to a method and apparatus for the synthesis of nanostructures using at least one solution providing at least one chemical element appropriate for the type of nanostructure, the method comprising the steps of: a) adding (admixing) a reducing agent to the at least one solution, b) bringing a suitable substrate into contact with the at least one solution before or after step a), c) forming nucleation growth sites on the substrate and d) maintaining the temperature at a suitable level for the growth of the nanostructures, characterized by the further steps of e) providing at least one space having at least one dimension in the micron range, e.g. in the range from 1 μm to 500 μm, adjacent a surface of the substrate, f) growing said nanostructures in said at least one space, g) periodically separating said nanostructures from the substrate and removing them.

15 Claims, 8 Drawing Sheets

(56) References Cited

U.S. PATENT DOCUMENTS

Figure 1:
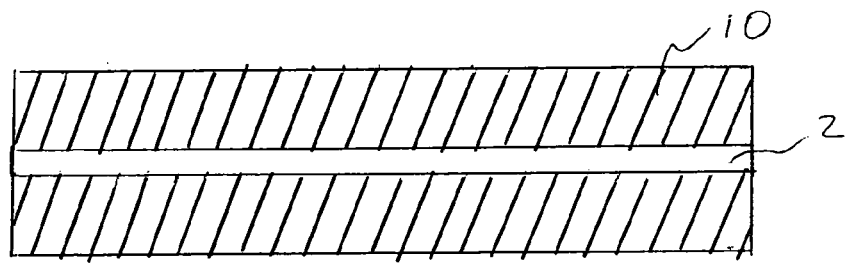

| | | | |
|---|---|---|---|
| 2004/0247517 A1 | 12/2004 | Zehnder et al. | |
| 2005/0164227 A1* | 7/2005 | Ogura et al. | 435/6 |
| 2005/0170089 A1 | 8/2005 | Lashmore et al. | |
| 2006/0008942 A1 | 1/2006 | Romano et al. | |
| 2006/0046447 A1* | 3/2006 | Yamamoto | 438/584 |
| 2008/0245184 A1* | 10/2008 | Lee et al. | 75/255 |

FOREIGN PATENT DOCUMENTS

| | | | | |
|---|---|---|---|---|
| EP | 2 045 332 A1 | 4/2009 | | |
| JP | 2008-189520 A | * | 8/2008 | C30B 29/18 |
| WO | WO 2004/001278 A2 | 12/2003 | | |
| WO | WO 2005/119753 A3 | 12/2005 | | |

OTHER PUBLICATIONS

Babu, G. Veera, et al., "Electroless Ni-P coated on graphite as catalyst for the electro-oxidation of dextrose in alkali solution," Journal of Solid State Electrochem, vol. 11, No. 12, pp. 1705-1712 (May 15, 2007).

Xiong, Shenglin, et al., "Solution-Phase Synthesis and High Photocatalytic Activity of Wurtzite ZnSe Ultrathin Nanobelts: A General Route to 1D Semiconductor Nanostructured Materials," Chemistry European Journal, vol. 13, pp. 7926-7932 (2007).

Shi, Liang, et al., "Synthesis of ZnSe nanodonuts via a surfactant-assisted process," Solid State Communicatons, vol. 146, pp. 384-386 (2008).

Qi, Xiao-Ying, et al., "Cadmium Telluride nanocrystals: synthesis, growth mode and effect of reaction temperature on crystal structures," NANO: Brief Reports and Reviews, vol. 3, No. 2, pp. 109-115 (2008).

Ghadiali, James E., et al., "Enzyme-Responsive Nanoparticle Systems," Advanced Materials, vol. 20, pp. 4359-4363 (2008).

Abed, Ovadia, et al., "Reversible Binding of Gold Nanoparticles to Polymeric Solid Supports," Chemistry of Materials, vol. 18, No. 5, pp. 1247-1260 (2006).

Wang, Zhong Lin, "Towards self-powered nanosystems: from nanogenerators to nanopiezotronics," Advanced Functional Materials, vol. 18, pp. 1-15 (2008).

Sotelo-Lerma, M., et al., "Preparation of CdTe coatings using the chemical deposition method," Journal of Organometallic Chemistry, vol. 623, pp. 81-86, (2001).

Patil, V.B., et al., "Cadmium telluride thin films: growth from solution and characteristics," Thin Solid Films, vol. 401, pp. 35-38 (2001).

Hua, Guomin, et al., "Fabrication of ZnO nanowire arrays by cycle growth in surfactantless aqueous solution and their applications on dye-sensitized solar cells," Materials Letters, vol. 62, pp. 4109-4111 (2008).

Schmidt-Mende, Lukas, "ZnO—nanostructures, defects, and devices," Materialstoday, vol. 10, No. 5, pp. 40-48 (May 2007).

Bu, Shaojing, et al., "Growth of ZnO Nanowires in Aqueous Solution by a Dissolution-Growth Mechanism," Hindawi Publishing Corporation, Journal of Nanomaterials, vol. 2008, pp. 1-5 (2008).

Yao, Xiumin, et al., "Growth Mechanism of β-SiC nanowires in SiC reticulated porous ceramics," Ceramics International, vol. 33, pp. 901-904 (2007).

Wang, Ming, et al., "Seed-layer controlled synthesis of well-aligned ZnO nanowire arrays via a low temperature aqueous solution method," J. Mater Sci, vol. 19, pp. 211-216 (2008).

Okada, T., et al., "Optical Characteristics of ZnO Nanowires Synthesized by Nanoparticle-Assisted Deposition and their Application to Sensors," Proc. of SPIE, vol. 6474, pp. 64741K-1 to 64741K-7 (2007).

Ho, G.W., et al., "One step solution sythesis towards ultra-thin and uniform single-crystalline ZnO nanowires," Appl. Phys. A, vol. 86, pp. 457-462 (2007).

Xu, F., et al., "A low-temperature aqueous solution route to large-scale growth of ZnO nanowire arrays," Journal of Non-Crystalline Solids, vol. 352, pp. 2569-2574 (2006).

* cited by examiner

AUTOSYNTHESIZER FOR THE CONTROLLED SYNTHESIS OF NANO- AND SUB-NANOSTRUCTURES

CROSS-REFERENCES TO RELATED APPLICATIONS

This application is a National Stage of International Application No. PCT/EP2009/009286 filed Dec. 28, 2009, and which claims the benefit of European Applications Nos. 08022555.0, filed Dec. 30, 2008, and 09005932.0, filed Apr. 29, 2009, the disclosures of which are incorporated herein by reference.

The present invention relates to a method for the synthesis of nanostructures and to an apparatus for the synthesis of nanostructures.

Nanostructures are known in different forms, for example, as quantum dots, nanoparticles, nanowires and nanotubes.

Nanostructures are becoming increasingly more interesting since the demand for even smaller and more compact integrated circuit technologies increases. For this reason the large scale production of nanostructures is becoming increasingly necessary.

Since nanostructures are not observed spontaneously in nature they must be produced in a laboratory. There are many known ways of forming nanostructures. Nanostructures can, for example be synthesized in a laboratory environment.

One growth method is to use a substrate suspended in a growth chamber, the substrate typically consisting primarily of $SiO_2$. This substrate is treated with a catalyst, for example, this catalyst being randomly selected from one of Ag, Se, Au, ZnO. A solution is subsequently added to the growth chamber, with the substrate and the catalyst being immersed in this solution. The solution typically consists of a salt of the desired nanostructure, for example, precursors for ZnSe, CdSe or CdTe nanostructures or a silicon salt for a Si nanostructure. An additive (reducing agent), for example, hexamine, is subsequently added to the solution in the growth chamber. The solution is heated to a temperature of typically 140° C. and the growth chamber is maintained at this temperature for a period selected to obtain the desired size of the nanostructure. Unfortunately, a varied range of nanostructures is grown besides the desired nanostructures and the desired nanostructures have to be separated from the remaining structures in subsequent steps further reducing the already low yield.

The precursors for CdSe nanostructures can be obtained by the addition of a mixture of $Cd(Ac)_2 \cdot 2H_2O$ and $Na_2SeO_3$. which, for example, is disclosed in the publication by Xiong et. al. "Solution-Phase Synthesis and High Photocatalytic Activity of Wurtzite ZnSe Ultrathin Nanobelts: A General Route to 1D Semiconductor Nanostructured Materials" published in Chemistry a European Journal in 2007 in volume 13 on pages 7929-7932.

ZnSe nanostructures can be obtained by the addition of the following mixture: 0.02 g of polyethylene glycol (PEG, Mw 20 000) are dissolved in 6 ml of distilled water, 10 ml ethanol and 1.5 g NaOH are initially added to the solution and this is then stirred for 2 minutes. Following this 0.09 g $Zn(CH_3CO_2)_2 \cdot 2H_2O$ are added to the solution together with 2 ml hydrazine hydrate and 0.16 g Se powder and the resultant solution is then stirred for a further 5 minutes before being transferred into the growth chamber. The temperature of the growth chamber is maintained at 180° C. for the growth period, this procedure is disclosed, for example, in the publication by Shi et. Al. "Synthesis of ZnSe nanodonuts via a surfactant-assisted process", published in Solid State Communications in 2008, volume 146 on pages 384-386.

CdTe nanostructures are obtained by the preparation of a Te injection solution containing 0.010 g Te (0.078 mmol) in a nitrogen atmosphere, by dissolving Te powder in 0.8 ml of trioctylphosphine (TOP) and then diluting this with 2.5 ml of 1-octadecene (ODE). While the Te sources are kept in a sealed vial, a mixture of 0.015 g (0.117 mmol) CdO and 0.12 g (0.8 mmol) of stearic acid are loaded into a 25 ml three-neck flask and diluted with 5 ml of ODE, the temperature is then increased to above 150° C. under $N_2$ flow until the CdO is dissolved, and then cooled down to room temperature in a final step, the Te is mixed with the CdO solution and 0.25 g (0.65 mmol) of trioctylphosphine oxide (TOPO) and 0.75 g (2.85 mmol) of octadeclamine are added and the mixture is then heated to between 130° C. and 250° C. to obtain the desired nanostructures. This is disclosed, for example, in the publication by Qi et. Al. "Cadmium Telluride nanocrystals: synthesis, growth mode and effect of reaction temperature on crystal structures", published in Nano: Brief reports and Reviews in 2008 volume 3, No. 2 on pages 109-115.

The main problem associated with the methods for the synthesis of nanostructures known today is that they are all associated with a small scale production, i.e. single piece production. Moreover, the control over the growth of the dimensions of these nanostructures is still very limited. In prior art growing techniques, the variety of nanostructures grown is immense, this is due to the fact that in the first 4 to 5 hours of heating the aqueous solution and reactant, a vast variety of nanostructures are obtained. In prior art growth apparatuses, the desired nanostructures can not be separated from the remainder prior to the end of the growth phase and the separation phase is very complicated and inefficient. Moreover, there is no direct control over the nanostructure morphologies grown.

The principal object of the present invention is to increase the yield of the nanostructures grown and to propose methods and apparatus which permit control of the growth of the composition and of the morphologies of the nanostructures grown. Leading to a higher yield of the nanostructures and a significantly narrower size and shape distribution of the nanostructures. A further object of the invention is to allow the nanostructures to be grown in solution.

In accordance with the invention this object is satisfied by a method of synthesising nanostructures using at least one solution providing at least one chemical element (precursor) appropriate for the type of nanostructure, the method comprising the steps of:
a) forming nucleation growth sites on the substrate,
b) adding (admixing) a reducing agent (growth promoter or an additive) to the at least one solution,
c) bringing a suitable substrate into contact with the at least one solution before or after step a) or step b) and
d) maintaining the temperature of the solution at a suitable level for the growth of the nanostructures, characterised by the further steps of
e) providing at least one space having at least one dimension in the micron range, e.g. in the range from 1 μm to 500 μm, adjacent a surface of the substrate,
f) growing said nanostructures in said at least one space at said nucleation growth sites, and optionally
g) periodically separating said nanostructures from the substrate and removing them.

By using, for example, foam which has a plurality of growth sites as the substrate and then utilizing the method in accordance with the invention a plurality of nanostructures can be grown at this plurality of growth sites in the interstitial spaces of the foam. Since even a modestly sized piece of foam has several thousand pores or interstitial spaces several thousand nanostructures can be grown at once in the same apparatus. Moreover, by maintaining the different parameters of the apparatus/process, such as, the temperature and concentration of the solution, the size (length and diameter) of the nanostructure can be controlled and by the step of optionally being able to periodically separate the nanostructures from the substrate and subsequently removing them. Furthermore, as the nanostructures can be removed periodically, the reducing agent and the at least one solution can be removed from a reaction unit containing the foam, enabling a separation of the unwanted nanostructures, floating about in the at least one solution and the reducing agent, before the wanted grown nanostructures are transferred from the reaction unit for further processing. In this way most of the unwanted nanostructures can be removed from the reaction unit prior to the separation of the desired nanostructure from the growth sites, thereby dramatically reducing the number of purification steps and increasing the yield and reducing the size distribution of wanted nanostructures significantly.

The reducing agent can also be termed a growth promoter or additive as the case may be. For example, in the production of ZnO nanostructures, at least three different types of ZnO nanostructure production can be considered. In these cases the addition of one or more compounds to the reducing agent (additives or growth promoters) facilitate the growth of the ZnO nanostructures in a particular direction by the addition of a growth direction agent to the reducing agent:

In a first case, for example, hexamine is used together with zinc nitrate for the production of ZnO nanowires, hexamine is a reducing agent and can also be used as a growth direction agent to reduce zinc nitrate to produce ZnO nanowires.

In a second case, for example, disc-like, flower-like and star-like ZnO nanostructures are produced using a mixture of zinc acetate and/or zinc nitrate with sodium hydroxide and citric acid. In this case the sodium hydroxide and citric acid both act as a reducing agent and the citric acid mainly facilitates the direction of growth (growth direction agent) thus producing different types of nanostructures.

In a third case the synthesis of ZnO nanotubes and nanowhiskers is effected using a mixture of zinc nitrate, ammonia and PEG (polyethylene glycol). In this case the ammonia is a reducing agent and polyethylene glycol is a growth direction agent.

In yet a further example to produce ZnSe nanostructures zinc acetate salt is used together with hydrazine hydrate and Se powder and solutions of PEG (polyethylene glycol) dissolved in water together with NaOH in ethanol, this mixture is known as a growth promoter.

In an advantageous embodiment of the method in accordance with the invention the nanostructures are removed from the production chamber by flushing these from said at least one space. In this way the grown nanostructures can be transferred in the liquid from the production chamber to a detector with which the growth of the desired nanostructures is characterized and/or checked and/or monitored. After achieving the desired size of the nanostructures as detected in the detector, the nanostructures remaining in the production chamber (reaction unit) are transferred to a collector unit in which they are collected until they are further processed, optionally together with the sample nanostructures in the detector.

Advantageously the growth of the nanostructures takes place in at least one of the following spaces:
a) a fluidic (microfluidic) passage,
b) a plurality of fluidic (microfluidic) passages,
c) an array of fluidic (microfluidic) passages,
d) spaces defined within a substrate material provided within a tube and
e) spaces defined between discrete bodies of substrate material provided within a tube.

By growing the nanostructures at a multiple number of different growth sites, for example, in the pores of a porous material e.g. porous aluminium, porous silicon, in a polyurethane foam, or in one or more fluidic (microfluidic) passages in a substrate, the overall surface area of the growth substrate is increased, i.e. the number of growth sites on the substrate is dramatically increased, which is equivalent to a substantial increase in the size of the reaction unit. The fluidic passages can equally be referred to as microfluidic passages in the context of this invention.

Advantageously the flow rate of the at least one solution and the reducing agent through the respective spaces is performed at a controlled rate, the controlled rate being in the range of 0.01 ml/hour to 10 ml/hour and preferably in the range of 0.1 ml/hour up to 1 ml/hour. In a particularly relevant example in practice this is done at a controlled temperature of the at least one solution and of the reducing agent, this temperature being in the range of 30° C. to 300° C. and preferably in the range of 80° C. to 95° C.

Controlling the flow rate and the temperature of the at least one solution and of the reducing agent enables a greater control to be achieved over the dimensions of the nanostructures grown.

The step of forming nucleation growth sites on the substrate advantageously comprises functionalising a surface of the substrate, for example by use of boronic compounds. This means that, prior to adding the at least one aqueous solution and/or the reducing agent to the reaction unit, the shape of the nanostructure to be grown can be influenced, i.e. whether wires, tubes or spheres etc. are grown. The chemical used to functionalize the surface may be a boronic compound selected to facilitate a separation of the grown nanostructures from the substrate. There are some examples of nanoparticle-DNA bonding systems which are enzyme responsive, which allow the nanoparticles to be used as imaging tools in cell-biology, for example, as is these are discussed in the publication by James E. Ghadiali, Molly M. Stevens, "Enzyme-Responsive Nanoparticle Systems" published in Advanced Materials volume 20 pages 4359 to 4363, whose contents is hereby incorporated.

Furthermore, systems with reversible binding of nanoparticles can be achieved where nanoparticles bond with another linker molecule (which is already attached to the stationary support) with the help of a molecule (capping molecule e.g. octanethiol monolayer on gold nanoparticle) on its surface. This bond between the capping molecule and the linker molecule (thiol or disulphide) is eventually broken with the release of nanoparticle from the stationary phase. This and similar chemical approaches are pro-vided in the publication by O. Abed et al. "Reversible Binding of Gold Nanoparticles to Polymeric Solid Supports," published in Chemistry of Materials Mater. 2006, volume 18, pages 1247-1260, whose contents is enclosed herewith.

An advantageous embodiment of the method of separating the nanostructures from the substrate comprises at least one of, chemically separating the nanostructures from the substrate by introducing a suitable chemical into said spaces, and/or the application of physical methods. These include the use of magnetic nanoparticles as the growth sites, these nanoparticles may be iron, ironoxide, cobalt, cobalt-tin etc. Alternatively, by exposing the substrate to a source of ultrasonic energy, for example using means to supply ultrasonic energy to the reaction unit, then the grown nanostructures can be detached from the growth sites via ultrasound.

By way of example the chemical applied to the surface of the substrate to form nucleation growth sites on the substrate prior to introducing at least one aqueous solution and the reducing agent into the growth chamber could be chosen such that it is dissolved upon the addition of a further chemical substance which does not harm either the substrate or the grown nano structure.

For example, one can use a mixture of zinc nitrate and hexamine to grow ZnO nanostructures. Hexamethylenetetramine (HMT) or hexamine is a highly water soluble, non-ionic tetradentate cyclic tertiary amine and thermal degradation of HMT releases hydroxyl ions which react with the Zn2+ ions to form ZnO. The Zn2+ ions come from the ionic dissociation of the zinc nitrate in solution. E.g.:

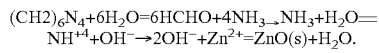

If magnetic nanoparticles are used as the catalyst particles for the growth sites then an applied magnetic field may hold these in place during the synthesis of the nanostructures and, upon the removal or switching off of this magnetic field, the nanostructures can be removed from the reaction unit. Alternatively, the nanostructures may be removed upon application of an electromagnetic field. Independent of the separation means selected, the wanted grown nanostructures can be kept in situ whilst the unwanted nanostructures are removed from the reaction unit in a first purification step, ensuring that fewer purification steps are required to obtain the wanted grown nanostructures. This increases the likelihood of the grown nanostructures not being damaged in the steps following the growth of the nanostructures, thus increasing the yield of the nanostructures.

In a particularly advantageous embodiment in accordance with the pre-sent invention a first reaction solution is exchanged for at least one further reaction solution to grow composite nanostructures, for example in the form of coated coaxial tubes or wires. Doing this nanoscale wires/tubes/semiconductors can be grown which need not be further treated or only require minimal further preparation prior to their integration into an electronic circuit. This means that nanoscale electronic circuit components can be grown in the autosynthesis apparatus in accordance with the invention, significantly decreasing the size of the electronic circuit to be built, and enabling a desired, more compact, electronic circuit de-sign.

In a particularly advantageous embodiment the method in accordance with the present invention is used to grow nanoscale junction semiconductors, e.g p-n junctions, n-p junctions or p-i-n structures or devices such as nanogenerators, transistors and piezoelectric elements. In this way the nanostructures grown can be implemented into an integrated circuit as a component without the need of further treating the nanostructure to obtain a desired semiconductor type. A nanogenerator is a miniature (nanoscale) power generator in which at least one of mechanical energy, vibrational energy and hydraulic energy is converted into electrical energy to power nanodevices without a battery, this is disclosed, for ex-ample, in the publication by Zhong Lin Wang, "Towards self-powered nanosystems: from nanogenerators to nanopiezotronics", published in advanced functional materials in 2008, volume 18, on pages 1-15.

In accordance with the invention there is also provided an apparatus for the synthesis of nanostructures and/or sub-nanostructures in accordance with any one or more of claims 8 to 15.

Figure 2:
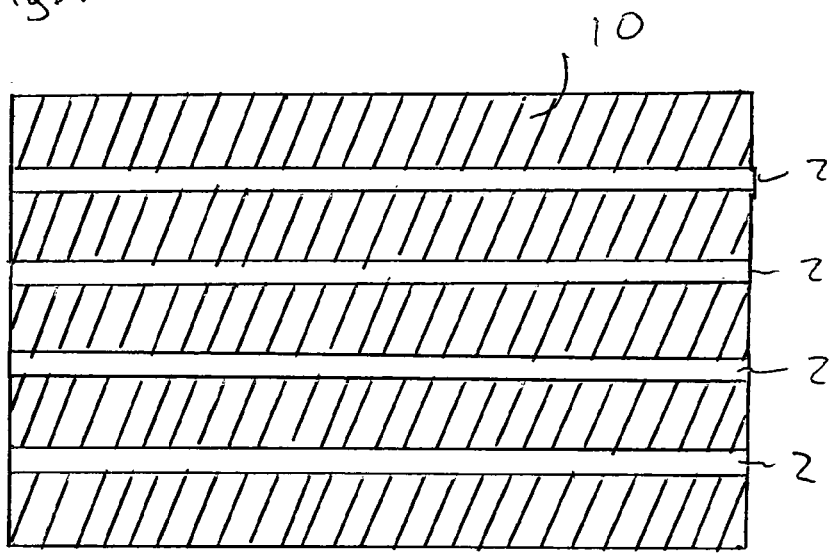
Figure 3:
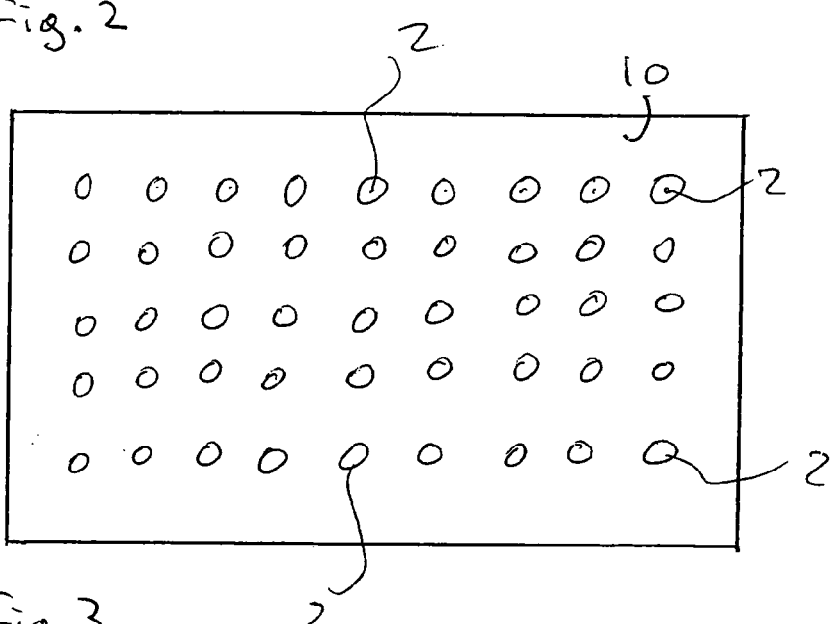
Figure 4:
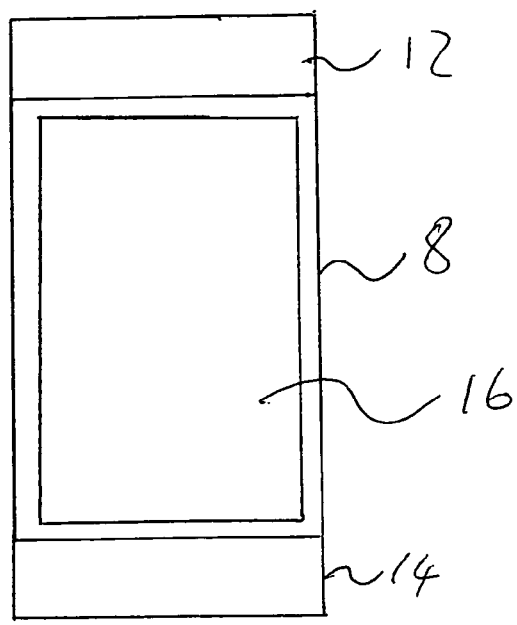
Figure 5:
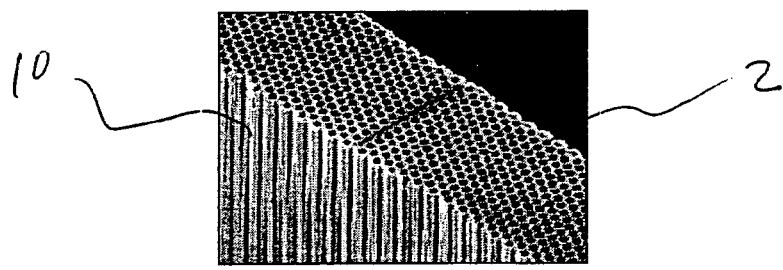
Figure 6:
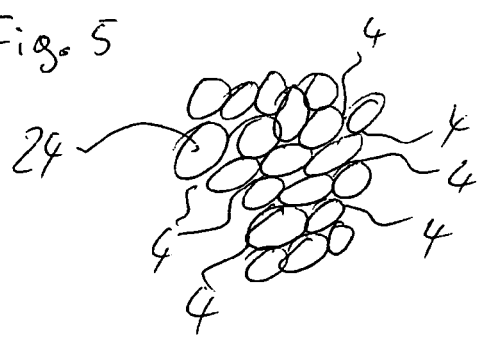
Figures 7, 8:
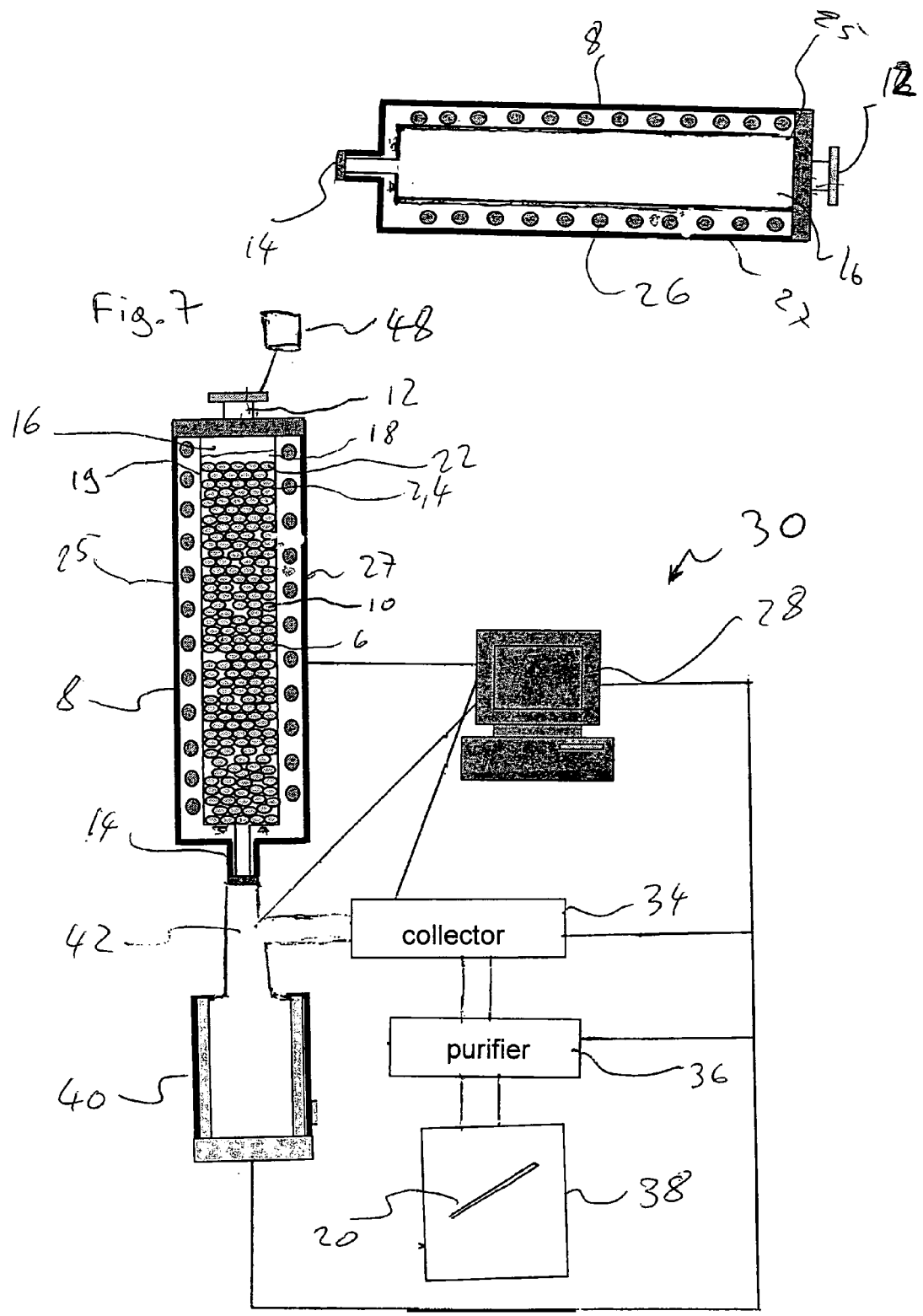
Figure 9:
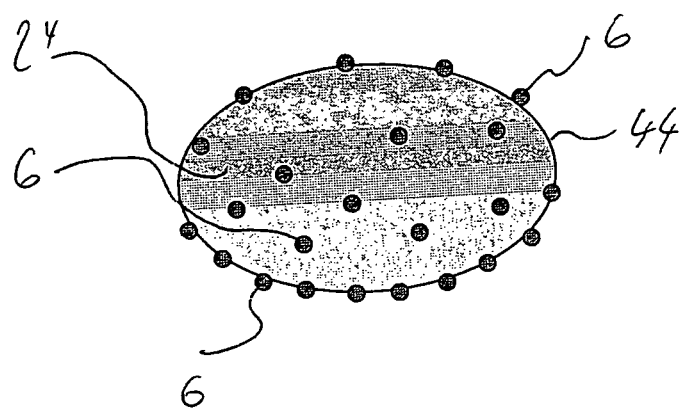
Figure 10:
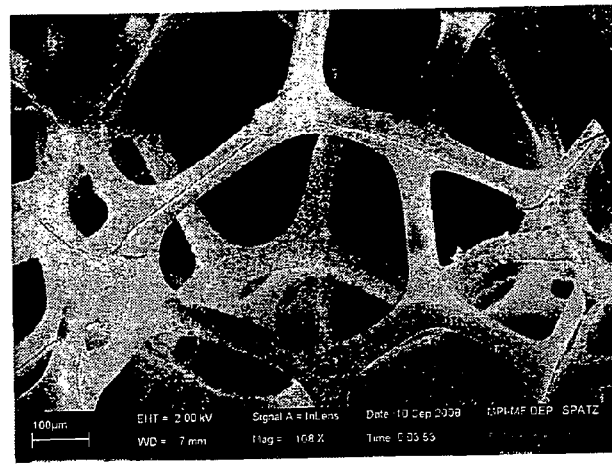
Figure 11:
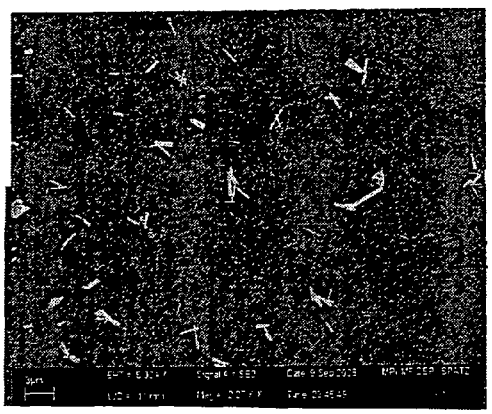
Figure 12:
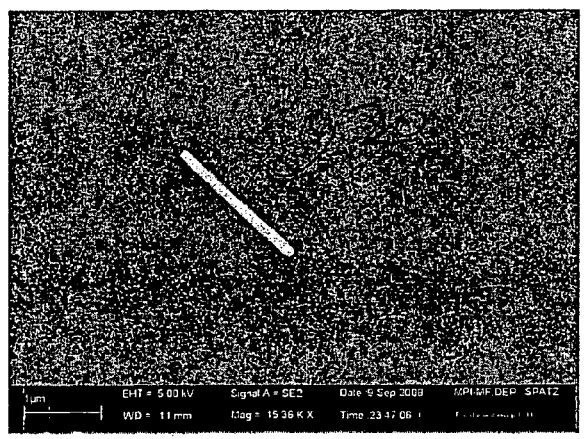
Figure 13:
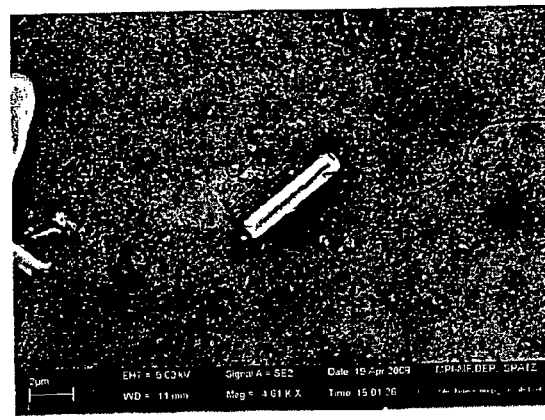
Figure 14:
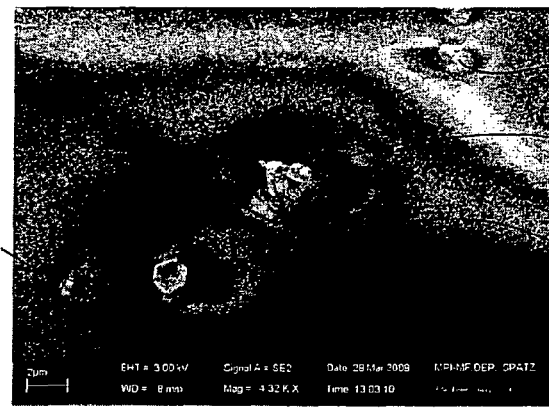
Figure 15:
Figure 16:
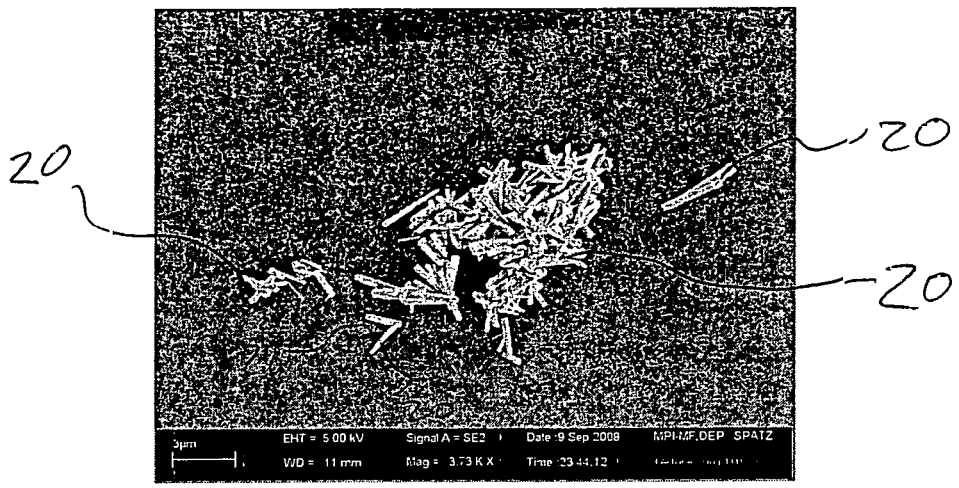
Figure 17:
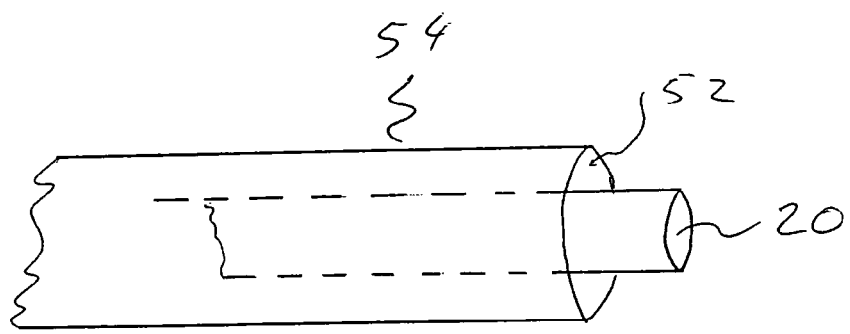
Figure 18:
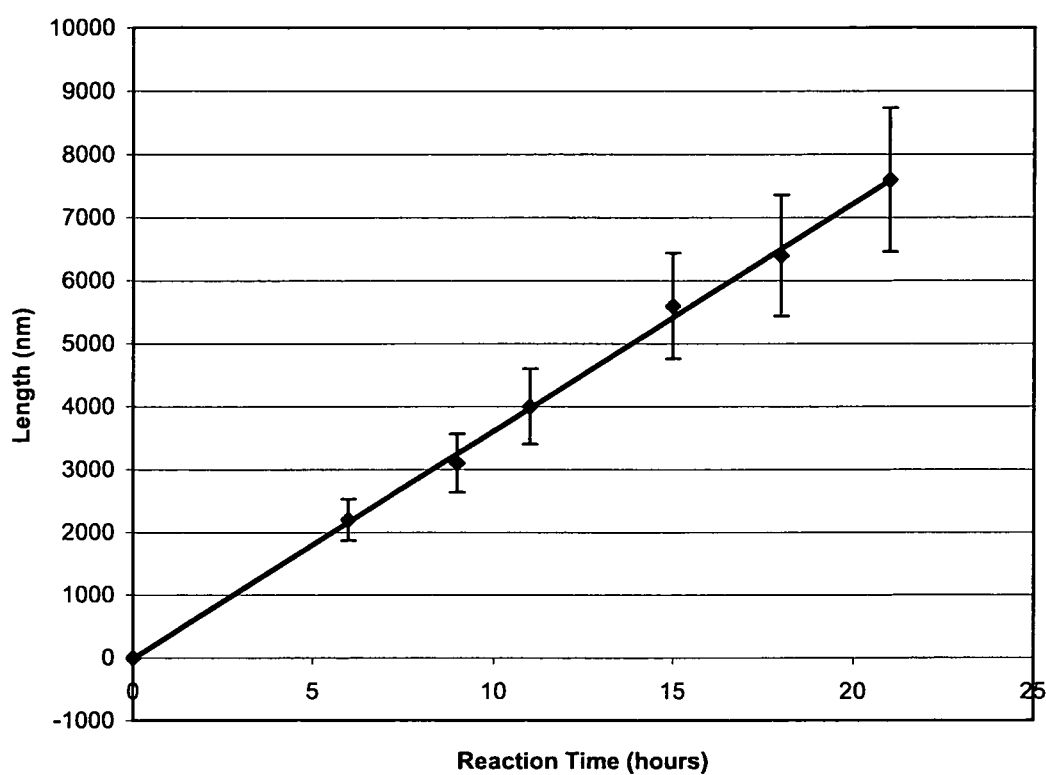

In the following the invention will be described in more detail by way of example only with reference to preferred embodiments and to the drawings; in which:

FIG. 1 shows a schematic view of a longitudinal section through a substrate with a fluidic passage in accordance with the invention, FIG. 2 shows a schematic view of a longitudinal section through a substrate with a plurality of fluidic passages in accordance with the invention, FIG. 3 shows a schematic front view of an array of fluidic passages in accordance with the invention, FIG. 4 shows a tube in accordance with the invention, FIG. 5 shows an SEM image of the spaces defined within a substrate material in accordance with the invention, FIG. 6 shows a schematic of the spaces defined between discrete bodies of substrate material in accordance with the invention, FIG. 7 shows a further tube in accordance with the invention, FIG. 8 shows a schematic of the synthesizer apparatus in accordance with the invention, FIG. 9 shows a schematic of a body having a plurality of catalysts on its outer surface in accordance with the invention, FIG. 10 shows an SEM image of polyurethane foam in accordance with the invention, FIG. 11 shows an example of a plurality of grown nanowires synthesized in accordance with the invention, FIG. 12 shows an example of a grown nanowire synthesized in accordance with the invention, FIG. 13 shows a further example of a grown nanowire synthesized in accordance with the invention, FIG. 14 shows a plurality of nanostructures growing on a piece of foam in accordance with the invention, FIG. 15 shows an SEM image of a cluster of nanostructures randomly growing in the aqueous solution in accordance with the invention, FIG. 16 shows an SEM image of a plurality of nanostructures grown in the aqueous solution in accordance with the invention, FIG. 17 shows a sketch of a coated nanowire grown in accordance with the invention, and FIG. 18 shows a graph illustrating the growth times of the nanostructures in accordance with the invention.

FIG. 1 shows a section through a substrate 10 showing a fluidic passage 2 passing through the substrate 10. This substrate can, for example, be a silicon based substrate such as $SiO_2$, or any other suitable substrate on which nanostructures can be grown, for example, a substrate taken from the non exclusive list of substrates including conducting glass (indium, tin oxide), silicon substrates, alumina membranes, Zn-foils, ZnNi foils, porous aluminium or the like. Typically these microfluidic passages 2 are in the order of 1 to 10 cm long, preferably 2 to 3 cm long and have a diameter of 1 μm to 500 μm and preferably typically about 10 to 100 μm.

FIG. 2 shows a section through a further substrate 10 showing a plurality of microfluidic passages 2. The substrate 10 can again be a silicon based substrate such as $SiO_2$ or any of the substrates 10 mentioned above.

FIG. 3 shows a front view of a substrate 10 having an array of microfluidic passages 2 provided within the substrate 10. The microfluidic passages 2 shown in FIGS. 1, 2 and 3 can be obtained by moulding the substrate 10 in a Petri dish. This is done by introducing thin wires of the desired size, e.g. 2 cm long 200 μm in diameter, as a negative mould into a Petri dish, or any other type of container, and then pouring the substrate in a fluid state into the Petri dish and letting the substrate solidify around this negative mould. By moulding several layers of this substrate and then removing the negative moulds and adding these layers to one another an array of microfluidic passages is obtained. Alternatively, these passages can be etched into the substrate 10 by using certain chemicals, or by laser cutting or water cutting technologies.

A type of moulding material could be polydimethylsiloxane PDMS-($C_2H_6OSi$), in which dimethylchlorosilane $Si(CH_3)_2Cl_2$ is polymerized into polydimethylsiloxane in the chemical reaction n $[Si(CH_3)_2Cl_2]$+n $[H_2O] \rightarrow [Si(CH_3)_2O]_n$+2n HCl (gas).

FIG. 4 shows a tube 8 in accordance with the invention. At its one longitudinal end it has an input unit 12 which is adapted for the input of substrates 10 having a plurality of microfluidic passages 2, or other types of substrates 10 such as spheres or beads 24 or foam 22 type substrates 10, which will be described later. The input unit is also designed for the introduction of one or more solutions 18 and/or reducing agents 19 (see FIG. 8) into the process chamber 16 of the tube 8. At its other longitudinal end the tube 8 has an output unit 14, from which the contents of the process chamber 16 including substrates 10, the at least one solution 18 and the synthesised nanostructures 20 (see FIG. 8) can be removed from the process chamber 16 of the tube 8, for further processing. The process chamber 16 may be adapted as a simple holder or a beaker as the case may be, both having a respective input unit 12 and an output unit 14. The input unit 12 and the output unit 14 may be formed with taps and/or valves which can be automatically controlled electronically or manually regulated.

FIG. 5 shows a porous substrate 10 in the form of porous $Al_2O_3$ which can be made by the processes described in WO 2008/014977. Alternative substrate materials 10 may be of foam 22 such as is shown in the form of an SEM image in FIG. 10. The substrate material 10 may also be any type of porous material which does not react with the precursors of the at least one aqueous solution 18 or reducing agent 19 (see FIG. 8) these may be porous silicon or porous aluminium, polyurethane foam, sepharose a cellulose material, or even porifera which are animals of the phylum and are also simply known as sponges. The function of these spaces 2 is to be seen as being the equivalent to the function of the microfluidic passages 2 shown in FIGS. 1 to 3.

FIG. 6 shows a schematic of the passages 4 or spaces 4 defined between discrete bodies of substrate material 10 provided within a tube 8 in accordance with the invention. If small spheres 24 or beads 24 are used as a substrate material 10, then not only are the nanostructures 20 and/or sub-nanostructures 20 grown on the outer surface of the spheres, but the passages 4 between the spheres 24 are also utilized for the growth of the nanostructures 20. The spheres 24 can be commercially available spheres or beads 24 (material?) having sizes in the mm to cm range, and can be filled into the process chamber 16 of the tube 8 via the input unit 12.

FIG. 7 shows a further tube 8 in accordance with the invention. The tube 8 also has an input unit 12 and output unit 14, in this particular embodiment the process chamber 16 also known as a reaction unit 16 is formed between the input and output units 12, 14 inside an inner tube 25. The inner tube 25 is disposed generally within an outer tube 27 of the tube 8. The space between the inner and the outer tubes 25, 26 is designed as an incubator unit 26, which include an electrical resistance heater used to control the temperature of the reaction. The incubator unit 26 may also be adapted to transfer ultrasonic waves to the reaction unit 16, or to apply a magnetic field to the reaction unit 16. For the purpose of generating an axial magnetic field use can be made of a coil (not shown) surrounding the outer tube 27 or the inner tube 25 and connected to an appropriate power supply. By reversing the polarity of the power supply the sign of the magnetic field acting on the substrates can be altered.

FIG. 8 shows a schematic of a synthesizer apparatus 30 in accordance with the invention, including a tube 8 having an input unit 12, a reaction unit 16, in this particular case the reaction unit is filled with spheres or beads 24, but can also be filled with any other substrate material 10 such as foam 22 the foam having interstitial passages 2 i.e. spaces 2. A liquid comprising at least one solution 18 and a reducing agent 19 for the growth of the nanostructures is provided in the reaction unit 16. Reference numeral 14 again refers to an output unit 14. The autosynthesizer apparatus 30 further comprises a computer and a screen 28 which includes the monitoring unit and the data analysing unit. The autosynthesizer apparatus 30 further comprises a characterization unit 40, a collector 34, a purification unit 36 and a sample container 38 for the final collection of the synthesised nanostructures 20. This autosynthesizer apparatus 30 is adapted for the synthesis of nanostructures 20 and/or sub-nanostructures.

In this example, the nanostructures 20 and/or sub-nanostructures are grown spheres or beads 24 or alternative substrates 10. The input unit 12 is a chemical input unit adapted for stationary and mobile phases. This means that the input unit 12 can transfer chemicals either continuously (mobile phase) or periodically (stationary phase) to the reaction unit 16. The synthesized nanostructures 20 and/or sub-nanostructures are synthesized in the tube 8 with a matrix and/or in a stationary phase in the foam substrate 10.

To grow nanostructures 20 and/or sub-nanostructures 20 in the synthesizer apparatus 30 of FIG. 8, in a first step, the reaction unit 16 is filled with a substrate material 10 via the input unit 12, which can include a lid for the tube 8. If needed the surface of the substrate 10 can be functionionalized using an organic material, for example, 3-aminopropyltriethoxysilane, 3-(2-aminoethylamino)propyltrimethoxysilane, (3-mercaptopropyl)trimethoxysilane) which forms at least one molecular layer on the surface of the substrate 10. Catalyst nanoparticles are subsequently added to the substrate 10 contained in the reaction unit 16. The functionalization and/or the addition of the catalyst nanoparticles can also take place outside of the reaction unit 16 prior to the introduction of the substrate 10 to the reaction unit 16.

These catalyst nanoparticles are different for the different types of synthesis. They can be either an organic or an inorganic material. They can be suspended in an organic or inorganic liquid such as toluene. The catalyst nanoparticles can be chosen from the group of metallic nanoparticle e.g. Ag, Au, Pt, Zn, Fe, Se, Bi and Co, oxide nanoparticles e.g. ZnO, or alloy nanoparticles as well as core-shell nanostructures.

The step of functionalizing the surface and/or adding catalyst nanoparticles is the step in which the growth sites 6 are formed on the substrate 10. Following the forming of nucleation growth sites 6 on the substrate, at least one aqueous solution 18 is added to the reaction unit 16. At the same time or at a time before or after adding the at least one aqueous solution 18 to the reaction unit 16 a reducing agent 19 is added to the reaction chamber or to the solution 18. The reducing agent 19 and the at least one aqueous solution 18 may be mixed in the tube 8 or re-circulated through the reaction unit 16 of the tube 8. For the time of growth, e.g. 45 hours, the temperature of the at least one solution 18 and the reducing agent 19 is maintained at a level suitable for growing the wanted nanostructures.

Using foam 22 or spheres or beads 24 or any porous material at least one space 2 or 4 having at least one dimension in the micron range, e.g. in the range from 1 mm to 500 mm, is provided in the reaction unit 16 adjacent a surface of the substrate 10.

The wanted nanostructures 20 are now grown in the at least one space 2 or 4 adjacent a surface of the substrate 10 in the reaction unit 16 for a certain period of time, until the wanted size of the nanostructure 20 has been achieved. To monitor the growth of the nanostructures 20, the aqueous solution is removed periodically from the reaction unit 18 via the out-put unit 14, thereby removing the unwanted structures also grown in the at least one aqueous solution 18. The reaction unit is refilled in this case with the same at least one aqueous solution 18 and reducing agent 19. Then the separation means of the tube 8 are switching on for a comparatively short time, for example, ultrasonic energy can be passed to the growth sites 6 to shake some of the nanoparticles from the growth sites 6. A part of the aqueous solution 18 now containing the grown nanostructures is guided to the characterization unit 40 via the output unit 14 and the junction 42, which can include a valve.

The characterization unit 40 contains a detector this being connected to the monitoring unit. The detector can be a fluorescence absorption spectrometer such as is described in the PCT application PCT/EP2008/005330. Other possible detectors installed in the characterization unit 40 can be absorbance spectrometers, impedance detectors or confocal measurement devices etc. This apparatus can periodically analyze the size and shape the sample of the nanostructures 20 admitted into the characterization unit 40. During this characterization phase and/or monitoring phase, the ultrasonic separation means are only switched on for a comparatively short time, and only a sample of the nanostructures is guided to the characterization unit 40 via the junction 42. The valve in the junction 42 is set in the characterization phase or monitoring phase so that the sample of the nanostructures 20 passes into the characterization unit 40. In a collection phase, the valve in the junction 42 is switched such that the nanostructures 20 are guided into the collector 34.

If the data analyzing unit 28 and the monitoring unit 28 determine from the sample that the required size and shape of the nanostructures 20 has been achieved, then on obtaining the wanted nanostructures 20 in the reaction unit 16, the unwanted nanostructures in solution in the liquid are again separated from the at least one aqueous solution 18 and then the grown nanostructures 20 adhering the substrate 10 are separated from the substrate 10 and are guided to the collector 34 via the output unit 14 and the valve at the junction 42.

Should the data analyzing unit 28 and the monitoring unit 28 determine that the sample of nanostructures 20 grown do not correlate with the wanted nanostructures 20, then the growth cycle can be aborted by simply removing the contents of the reaction unit 16 via the output unit 14. As the apparatus 30 is reusable, having flushed the contents from the reaction unit 16, the growth process can be restarted. Or, as the case may be, if a new type of nanostructure is to be grown a further growth cycle may be implemented.

In the embodiment shown in FIG. 8 the monitoring unit 28 and the data analysing unit are shown in the form of a computer, they may however be two separate electronic units or be formed on a different type of micro-processing unit as the case may be. They may also be an analyzer for nanostructures as described in the PCT application PCT/EP2008/005330. Furthermore, the computer can be used to control the temperature in the reaction unit 16 and the flow rates of liquids into and out of the reaction unit.

As can be clearly seen in FIG. 8 the nanostructures 20 can be flushed from the interstitial passages 4 or the microfluidic passages 2 by introducing a flushing solution 18 via the input unit 12 to flush the nanostructures 20 from the at least one space 2 or 4 to a collection point in the collector 34 via the output unit 14 of the tube 8 or to the detector contained in the characterization unit 40.

FIG. 9 shows a schematic of a body 24 (sphere 24) having a plurality of catalyst particles 6 on its outer surface 44. These catalyst particles 6 can be a wide variety of catalyst particles 6 consisting of, for example, gold, silver, platinum etc., moreover they are also known as growth initiators. These catalystic particles 6 can be introduced into the reaction chamber 16 of the synthesizer apparatus 30, in an aqueous solution 18. In this way, they are distributed either into the microfluidic passages 2 of the substrate 10 or into the interstitial passages 4 of the substrate 10 or onto the surface 44 of the substrate.

Following the subsequent release of the catalyst solution 18 from the reaction chamber 16 via the output unit 14, an aqueous solution 18 containing elements and/or compounds of the desired nanostructure 20 is introduced via the input unit 12 into the reaction chamber 16. The incubator unit 26 is then switched on and the contents of the reaction unit 16 are maintained at a constant temperature for the growth time of the nanostructures 20. A reducing agent 19 is added to the reaction unit 16. This reducing agent 19 can be hexamine $((CH_2)_6N_4)$ in the case of the production of ZnO nanowires, where zinc-nitrate is used as a growth solution.

The apparatus 30 of FIG. 8 includes means for flowing the at least one solution 18 and (reducing agent) additive 19 through the respective spaces 2, 4 at a controlled rate and at a controlled temperature. The controlled flow rate is typically in the range of 0.01 ml/hour to 10 ml/hour and preferably in the range of 0.1 ml/hour up to 1 ml/hour. The typical operating temperatures are in the range of +30° C. to +300° C. and preferably in the range of +80° C. to +95° C.

The nanostructures 20 synthesised in the reaction unit 16 can be re-moved from the substrate 10 by at least one of the following, either by generating ultrasonic vibration at the incubator unit 26, for example, using a suitable piezo generator to produce ultrasonic energy to shake the nanostructures 20 from their growth sites before removing these from the reaction chamber. Alternatively the separation of the nanostructures 20 from the substrate 10 can be achieved by introducing a suitable chemical into the spaces 2 or 4 via the input unit 12 for the chemical separation of the nanostructures from the growth sites.

If magnetic catalyst nanoparticles 6 are being used, then the separation of the nanostructures 20 can be achieved by applying a magnetic field or removing an applied magnetic field from the tube 8.

A supply container (not shown) may also be provided to supply at least one further reaction solution 18 to the tube 8 via the input unit 12 to enable the growth of composite nanostructures 20, for example in the form of coated coaxial tubes 54 or wires 54. Thus the coaxial tube or wire may have a core of one composition formed from a first solution and a mantle formed from a further solution.

In prior art growing techniques, the variety of nanostructures 20 grown is immense, this is due to the fact that in the first 4 to 5 hours of heating the aqueous solution 18 and reactant 19, a vast variety of nanostructures 20 are grown in the aqueous solution 18. In prior art growth apparatuses, these can not be separated from the desired nanostructures prior to the end of the experiment. Moreover, the control of the growing nanostructures is basically non-existent.

These unwanted nanostructures 50 (see FIG. 15) can be flushed out from the apparatus 30 in accordance with the invention prior to the separation of the desired nanostructures 20, since the release of the nanostructures 20 from the spaces 2,4 of the substrates 10 can be performed in an auto-mated intermediate step after the removal of the waste fluid, and the de-sired nanostructures 20 can be separated from the substrate 10 and flushed from the reaction unit 16. This can be seen as a first purification step.

A pumping unit 48 (see FIG. 8) is used to pump at least one of the following liquids: an aqueous solution 18, a reducing agent 19, a solution containing the catalyst particles 6, a solution 18 for the preparation of the surfaces 44 of the substrate 10 or the substrates 10, further solutions if coated nanowires are to be generated, or a chemical solution for the separation of the nanostructures 20 into and out of the tube 8.

The purification unit 36 (see FIG. 8) is adapted to purify any remaining raw materials and impurities from the synthesized nanostructures 20 and/or sub-nanostructures 20. The characterization unit 40 and/or the analyzing unit 28 is/are adapted to calculate the quantum yield and to identify the product purity and to identify the type of product.

In the apparatus 30 of FIG. 8 the dimensions of the synthesized nanostructures and/or sub-nanostructures are directly related to the time of growth and the concentration of the solution and the temperature of the solution.

FIG. 10 shows an SEM image of polyurethane foam 22 prior to the growth of nanostructures 20 on the foam 22 in the interstitial spaces 4 of the foam or in the interstitial passages 2 or pores between different elements of foam material 22. One great advantage of the foam 22 is that it is reusable and extremely inexpensive. I.e. after one batch of nanostructures has been grown the foam 22 in the apparatus 30 can be flushed with a cleaning liquid, and subsequently the apparatus 30 is reused, as is the foam 22, to grow another batch of nanostructures 20. An SEM image is a scanning electron microscope image and the relative magnification is given in the images of the following Figures.

FIG. 11 shows an SEM image of a sample of a plurality of ZnO nanowires 20 grown in a 1 mM aqueous precursor solution of zinc nitrate grown over polyurethane foam 22 in an apparatus 30 in accordance with the invention for 45 hours at 85° C. The nanowires 20 synthesized are all approximately 3 μm in length and it can be seen that a plurality of similar nanowires 20 were grown. The nanowires 20 were all grown on substrate which were not functionalized prior to the growth of the nanowires, which accounts for the not quite uniform nanowires and conglomerations of nanowires, i.e. bundles of nanowires.

FIG. 12 shows an SEM image of a single nanowire 20 grown in accordance with the invention. In this example, the ZnO nanowire 20 grown is approximately 2.5 μm long and is grown in a 10 mM aqueous precursor solution of zinc nitrate over polyurethane foam 22 for 45 hours at 85° C.

FIG. 13 shows an SEM image of a further example of a nanowire 20 of ZnO grown in accordance with the invention. In this example, the nanowire 20 is approximately 4 μm long and is grown in a 100 mM aqueous precursor solution of zinc nitrate over polyurethane foam 22 for 45 hours at 85° C.

FIG. 14 shows an SEM image of a plurality of nanostructures 20 of ZnO growing on a piece of foam 22 in an apparatus 30 in accordance with the invention. In this example, the nanostructures 20 are grown in a 10 mM aqueous precursor solution of zinc nitrate over polyurethane foam 22 at 85° C.

FIG. 15 shows an SEM image of a number of clusters 50 of nanostructures of ZnO randomly growing in an aqueous solution 18 of zinc nitrate. In the apparatus 30 in accordance with the invention, these clusters 50 can be separated from the desired nanostructures 20 by flushing the reaction unit 16 prior to the release of the wanted nanostructures 20. In this example, the clusters 50 are grown in a 10 mM aqueous precursor solution at 85° C.

FIG. 16 shows an SEM image of a plurality of ZnO nanostructures 20 grown in the apparatus 30 in accordance with the invention. In this example, the nanostructures 20 are grown in a 10 mM aqueous precursor solution of zinc nitrate over polyurethane foam 22 at 85° C. The lengths of the nanostructures 20 grown are all very similar and as one can see they are all longitudinal structures which are also known as nanowires. Similarly nanotubes can be grown. As can be seen the output of the apparatus 30 in accordance with the invention is a plurality of similar nanowires 20. The actual length and or diameter selection of the nanowires 20 can take place in a centrifuge which can be provided in either the collector 34 or a purification unit 36 before the nanowires 20 are placed into the sample container 38. The nanowires can be selected from the container 38 for further use, for example, in electronic circuits.

The nanostructures 20 grown can be nanowires and/or nanotubes, or even simple semiconductor structures. If, in the growth process, the aqueous solution 18 is changed then p-n junctions, n-p junctions, p-i-n junctions and the like can be grown, moreover the nanowires can have a covering layer grown on top of a previously formed nanostructure, for example, forming an insulating wire if the corresponding aqueous solutions 18 and reactants are appropriately chosen.

FIG. 17 shows a sketch of a layered nanowire 54. Clearly seen is the nanowire 20 consisting of ZnO and the outer cover 52 consisting of $SiO_2$. This is easily achieved in the apparatus 30 in accordance with the invention, as the substrate 10 and the growing nanostructures 20 do not have to be removed when the aqueous solution 18 is changed.

To grow n-type ZnO wires then, precursor solutions of, for example, zinc nitrate and hexamine, zinc nitrate and triethanolamine, zinc acetate and hexamine or zinc nitrate with thiourea, ammonium chloride and ammonia etc. are used. It seems possible to grow p-type ZnO nanowires by doping the ZnO with a few acceptor atoms such as N, Co and As etc. and thereby lowering the band-gap of ZnO nanostructures.

FIG. 18 shows a graph illustrating the growth times of the nanostructures in accordance with the invention, in this the size (i.e. the length) of the nanostructure 20 is plotted against the time of growth for different concentrations of the at least one aqueous solution 18. It can be clearly seen that the length and the diameter of the nanostructure grown is almost linearly dependent on the growth time, and a desired size of a nanostructure can be selected in time on utilization of the apparatus 30 in accordance with the invention.

Moreover the yield of the desired nanostructures can be significantly increased using the apparatus 30 in accordance with the invention.

In all embodiments shown, the nanostructures 20 and/or sub-nanostructures 20 grown can again be controllably removed using chemistry at the growth site; however, they may also be removed using ultra-sound and/or by utilizing magnetic nanoparticles and turning off a magnetic field in the column and thereby releasing the grown nanostructures 20. A combination of all three removing techniques may also be utilized in the reaction unit 16 to remove the grown nanostructures 20 from the growth sites prior to these being transferred into the collection unit 34.

The nanostructures 20 and/or sub-nanostructures 20 grown using the method and/or the apparatuses 30 in accordance with the invention are preferably ZnO nanostructures 20 but by controlling the chemistry in the chamber, i.e. which solution is added to the chamber, the temperature in the chamber, any type of nanostructure 20 may be grown in any geometry and size typically at temperatures ranging between 30° C. and 300° C. in an aqueous solution and at an ambient pressure. A non-inclusive list of examples of inorganic and/or organic nanostructures which can be grown includes: polysulphurnitride x(SN), telenium, tellurium, molybdenum chalcogenides, gold, silver, platinum, titanium oxide ($TiO_2$), manganese oxide ($MnO_2$), indium oxide ($InO_2$), cadmium selenide (CdSe), cadmium sulphide (CdS), cadmium telluride (CdTe), copper sulphide (CuS), copper selenide (CuSe), cadmium sulphide (CdS), zinc sulphide (ZnS), zinc selenide (ZnSe), indium phosphide (InP), indium arsenide (InAs), gallium arsenide (GaAs) and the like. Moreover polymer materials such as polypyrrole, poly (3-methylthiophene), polyaniline or the like may be grown using the method and apparatuses in accordance with the invention.

To obtain different kinds of material grown in the chamber different purifying solutions such as water or any other solution, can be used. The contents of the chamber can be removed after the desired nanostructures have been achieved and can consequently then be further utilized. An exemplary use of the sponges could be to remove heavy metal such as As from water by using the ZnO nanostructures grown in the column as a ZnO heavy metal scavenger. A different use of the ZnO nanostructures could be to remove bacteria from contaminated water.

Table 1 below shows the different morphologies of ZnO nanostructures 20 grown in different aqueous solutions 18 and reducing agents 19. The mixture of aqueous salt solution(s) 18 and reducing agent(s) 19 is also known as a growth solution 18, 19. These different zinc salts in solution 18 and reducing agents 19 can alter the nanostructure and shape of the nanostructures 20 achieved significantly. The different morphologies listed in Table 1 illustrate what is understood by the different types and shapes of nanostructures 20 and/or sub-nanostructures 20 which can be grown in the apparatus 30 in accordance with the invention.

The substrates used most for the growth of the different ZnO nanostructures 20 shown in Table 1, have been conducting glass (indium, tin oxide), silicon substrates and alumina membranes.

| growth solution 18, 19 | ZnO nanostructure grown 20 |
|---|---|
| zinc nitrate, HMT | nanorods, microtubes |
| zinc nitrate, HMT | nanorods, nanotubes |
| zinc nitrate, HMT | aligned nanowire arrays |
| zinc nitrate, HMT, citriate | oriented nanocolumns, nanoplates |
| zinc nitrate, zinc acetate, HMT | highly aligned nanorods |
| zinc nitrate, triethanolamine, HCL (pH 5) | ordered nanorods |
| zinc nitrate, thiourea, ammonium chloride, ammonia | nanowires, tower-like nanostructures, flower-like nanostructures, tube-like nanostructures |
| zinc acetate, sodium hydroxide, citric acid | disc-like nanostructures, flower-like nanostructures, nanorods, star-like nanostructures |
| Zn-foil, zinc sulphate, ammonium ions, sodium hydroxide | nanobelt arrays, ordered nanowires |

Table 1. Shows the different types of morphologies of the ZnO nanostructures 20 grown in dependence of the type of growth solution 18, 19 used to grow the ZnO nanostructures 20.

Typical concentrations of the salts in the solution range between 0.1 mM and 1000 mM and in particular between 1 mM and 100 mM. Depending on the concentration the time of growth of the nanostructure 20 varies. Moreover different concentrations can vary the growth ratios of different nanostructures 20, i.e. approximately the same length of nanostructure 20 may be achieved for the same time of growth, but the diameter of the nanostructure 20 can be significantly larger or smaller depending on the concentration.

The invention claimed is:

1. A method of synthesising nanostructures (20) using at least one solution (18) providing at least one chemical element appropriate for the type of nanostructure (20), the method comprising the steps of:
    a) forming nucleation growth sites (6) on a substrate (10, 22, 24)
    b) adding a reducing agent (19) to the at least one solution (18),
    c) bringing the suitable substrate (10 22, 24) into contact with the at least one solution (19) before or after step a) or step b) and
    d) maintaining the temperature of the solution (18, 19) at a suitable level for the growth of the nanostructures (20), characterised by the further steps of
    e) providing at least one space (2; 4) having at least one dimension in the micron range from 1 μm to 500 μm, adjacent a surface of the substrate (10),
    f) growing said nanostructures (20) in said at least one space (2; 4), and optionally
    g) periodically separating said nanostructures (20) from the substrate (10, 22, 24) and removing them.

2. A method in accordance with claim 1, wherein the removal of the nanostructures (20) is effected by flushing them from said at least one space (2; 4).

3. A method in accordance with claim 1, wherein growth of said nanostructures (20) takes place in at least one of the following spaces (2; 4):
    a) a microfluidic passage (2),
    b) a plurality of microfluidic passages (2),
    c) an array of microfluidic passages (2),
    d) spaces (2) defined within a substrate material (10; 22; 24) provided within a tube (8), and
    e) spaces (4) defined between discrete bodies (22; 24) of substrate material (10) provided within a tube (8).

4. A method in accordance with claim 3 and including the further step of flowing the at least one solution (18) and reducing agent (19) through the respective spaces (2; 4) at a controlled rate and at a controlled temperature.

5. A method in accordance with claim 1, wherein the step of forming nucleation growth sites on the substrate (10) comprises functionalising a surface (44) of the substrate (10).

6. A method in accordance with claim 1, wherein the step of separating the nanostructures (20) from the substrate (10, 22, 24) comprises at least one of
    a) chemically separating them from the substrate (10, 22, 24) by introducing a suitable chemical into said spaces (2, 4), and
    b) physical methods including the use of magnetic nanoparticles or by exposing the substrate (10, 22, 24) to a source of ultrasonic energy.

7. A method in accordance with claim 1, wherein a first reaction solution (18, 19) is exchanged for at least one further reaction solution (18, 19) to grow composite nanostructures (20) in the form of coated coaxial tubes (54) or wires (54).

8. A method in accordance with claim 7, wherein said method is used to grow nanoscale junction semiconductors including p-n junctions, n-p junctions or p-i-n structures.

9. An apparatus (30) for synthesising nanostructures (20) using a solution (18, 19) based method with at least one solution (18, 19) providing at least one chemical element appropriate for the type of nanostructure (20), the apparatus

(30) comprising a holder for a substrate (10; 22; 24), at least one space (2, 4) defined in, at or by the substrate material (10; 22; 24), said space (2; 4) having at least one dimension in the micron range from 1 µm to 500 µm, said space (2; 4) being fillable by said at least one solution (18) and a reducing agent (19) and optionally a means (26) for periodically separating said nanostructures (2) grown at nucleation sites at said substrate (10; 22; 24) in said spaces (2; 4).

10. An apparatus (30) in accordance with claim 9, wherein means (12; 14; 48) is provided for flushing said nanostructures (20) from said at least one space (2; 4) to a collection point (34; 36; 38; 40).

11. An apparatus (30) in accordance with claim 9, wherein it has at least one of the following spaces (2; 4) for growth of said nanostructures (20):
   a) a microfluidic passage (2),
   b) a plurality of microfluidic passages (2),
   c) an array of microfluidic passages (2),
   d) spaces (2; 4) defined within a substrate material (10; 22; 24) provided within a tube (8), and
   e) spaces (2; 4) defined between discrete bodies (22, 24) of substrate material (10; 22; 24) provided within a tube (8).

12. An apparatus (30) in accordance with claim 11 and including means (12; 14; 48) for flowing the at least one solution (19) and reducing agent (19) through the respective spaces (2; 4) at a controlled rate and at a controlled temperature.

13. An apparatus (30) in accordance with claim 9, wherein the substrate (10) has a functionalised surface (44) forming nucleation growth sites (6) for said nanostructures (10).

14. An apparatus (30) in accordance with claim 9, wherein the means for separating the nanostructures (20) from the substrate (10) comprises at least one of
   a) a source of ultrasonic energy,
   b) means (12; 48) for introducing a suitable chemical (19) into said spaces (2; 4), and
   c) means for applying a magnetic field in said apparatus (30).

15. An apparatus (30) in accordance with claim 9, wherein a supply container (46) for at least one further reaction solution (18; 19) is provided to enable the growth of composite nanostructures (20) in the form of coated coaxial tubes (54) or wires (54).

\* \* \* \* \*